(12) United States Patent
Bader (10) Patent No.: US 9,091,936 B2
(45) Date of Patent: Jul. 28, 2015

(54) ILLUMINATION SYSTEM OF A MICROLITHOGRAPHIC PROJECTION EXPOSURE APPARATUS

(75) Inventor: Dieter Bader, Goeggingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 945 days.

(21) Appl. No.: 13/214,811

(22) Filed: Aug. 22, 2011

(65) Prior Publication Data

US 2012/0002184 A1    Jan. 5, 2012

Related U.S. Application Data (63) Continuation of application No. PCT/EP2009/002016, filed on Mar. 19, 2009.

(51) Int. Cl.
*G03B 27/54* (2006.01)
*G03B 27/42* (2006.01)
*G03F 7/20* (2006.01)

(52) U.S. Cl.
CPC ........ *G03F 7/70116* (2013.01); *G03F 7/70108* (2013.01)

(58) Field of Classification Search
CPC ............ G03F 7/70091; G03F 7/70108; G03F 7/70116; G03F 7/70125
USPC ..................................................... 355/67, 53
See application file for complete search history.

(56) References Cited

U.S. PATENT DOCUMENTS

| | | | |
|---|---|---|---|
| 7,061,582 B2 | 6/2006 | Zinn et al. | |
| 2003/0086524 A1* | 5/2003 | Schultz et al. | 378/34 |
| 2004/0036977 A1 | 2/2004 | Tanaka et al. | |
| 2005/0018294 A1 | 1/2005 | Hauschild | |
| 2006/0050261 A1 | 3/2006 | Brotsack | |
| 2006/0055834 A1 | 3/2006 | Tanitsu et al. | |
| 2006/0087634 A1 | 4/2006 | Brown et al. | |
| 2009/0091730 A1* | 4/2009 | Tanaka | 355/67 |

FOREIGN PATENT DOCUMENTS

| | | |
|---|---|---|
| EP | 1 262 836 A1 | 2/2002 |
| EP | 1 681 710 A | 7/2006 |
| WO | WO 2005/026843 A2 | 3/2005 |
| WO | WO 2005/078522 A | 8/2005 |
| WO | WO 2008/095695 A2 | 8/2008 |
| WO | WO 2009/035129 | 3/2009 |

OTHER PUBLICATIONS

International Search Report for the corresponding PCT Application No. PCT/EP09/002016, mailed Mar. 18, 2009.

* cited by examiner

*Primary Examiner* — Peter B Kim
(74) *Attorney, Agent, or Firm* — Fish & Richardson P.C.

(57) ABSTRACT

An illumination system of a microlithographic projection exposure apparatus includes a light source configured to produce projection light that propagates along a light path. The illumination system also includes a beam deflection array of reflective or transmissive beam deflection elements. Each beam deflection element is configured to deflect an impinging light beam by a deflection angle that is variable in response to a control signal. The beam deflection array is used in a first mode of operation to determine an irradiance distribution in the system pupil surface. The system further includes an optical raster element, in particular a diffractive optical element, which is used in a second mode of operation to determine the irradiance distribution in the system pupil surface. An exchange unit is configured to hold the optical raster element in the second mode of operation such that it is inserted into the light path.

18 Claims, 6 Drawing Sheets

ILLUMINATION SYSTEM OF A MICROLITHOGRAPHIC PROJECTION EXPOSURE APPARATUS

CROSS-REFERENCE TO RELATED APPLICATION

This application is a continuation of, and claims benefit under 35 USC 120 to, international application PCT/EP2009/002016, filed Mar. 19, 2009, which is hereby incorporated by reference in its entirety.

FIELD

The disclosure generally relates to illumination systems of microlithographic exposure apparatus that image a mask onto a light sensitive surface. More particularly, the disclosure relates to such illumination systems that contain an array of mirrors or other beam deflection elements for producing a desired irradiance distribution in a system pupil surface of the illumination system.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV), vacuum ultraviolet (VUV) or extreme ultraviolet (EUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective for imaging the mask on the photoresist, and a wafer alignment stage for aligning the wafer coated with the photoresist.

As the technology for manufacturing microstructured devices advances, there are ever increasing demands also on the illumination system. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions along which the rays constituting the light bundle propagate.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a system pupil surface of the illumination system. With an annular illumination setting, for example, only an annular region is illuminated in the pupil surface. Thus there is only a small range of angles present in the angular distribution of the projection light, and thus all light rays impinge obliquely with similar angles onto the mask.

Different approaches are known in the art to modify the angular distribution of the projection light in the mask plane so as to achieve the desired illumination setting. In the simplest case a stop (diaphragm) including one or more apertures is positioned in a pupil surface of the illumination system. Since locations in a system pupil surface translate into angles in a Fourier related field plane such as the mask plane, the size, shape and location of the aperture(s) in the pupil surface determines the angular distributions in the mask plane. However, a significant fraction of the light produced by the light source is absorbed by the stop. This fraction cannot contribute to the exposure of the resist, which results in a reduced throughput of the apparatus. Furthermore, any change of the illumination setting involves a replacement of the stop. This makes it difficult to finally adjust the illumination setting, because this would involve a very large number of stops that have apertures with slightly different sizes, shapes or locations.

Many common illumination systems therefore include adjustable elements that make it possible, at least to a certain extent, to continuously vary the illumination of the pupil surface. Conventionally, a zoom axicon system including a zoom objective and a pair of axicon elements are used for this purpose. An axicon element is a refractive lens that has a conical surface on one side and is usually plane on the opposite side. By providing a pair of such elements, one having a convex conical surface and the other a complementary concave conical surface, it is possible to radially shift light energy. The shift is a function of the distance between the axicon elements. The zoom objective makes it possible to alter the size of the illuminated area in the pupil surface.

With such a zoom axicon system only conventional and annular illumination settings can be produced. For other illumination settings, for example dipole or quadrupole illumination settings, additional stops or optical raster elements are involved. An optical raster element produces, for each point on its surface, an angular distribution which corresponds in the far field to certain illuminated areas. Often such optical raster elements are realized as diffractive optical elements, and in particular as computer generated holograms (CGH). By positioning such an element in front of the pupil surface and placing a condenser lens in between, it is possible to produce almost any arbitrary intensity distribution in the system pupil surface. The condenser may be formed by a zoom optical system such that it has a variable focal length. Furthermore, an additional axicon system may be used to vary, at least to a limited extent, the illumination distribution produced by the optical raster element.

However, the zoom axicon system provides only limited adjustability of the illumination setting. For example, it is not possible to vary the distance between a pair of opposite poles of a quadrupole illumination setting without affecting also the other pair of poles. To this end another optical raster element has to be used that is specifically designed for this particular intensity distribution in the pupil surface. The design, production and shipping of such optical raster elements is a time consuming and costly process, and thus there is little flexibility to adapt the light intensity distribution in the pupil surface to the desired properties of the operator of the projection exposure apparatus.

For increasing the flexibility in producing different angular distribution in the mask plane, it has recently been proposed to use mirror arrays that illuminate the pupil surface.

In EP 1 262 836 A1 the mirror array is realized as a microelectromechanical system (MEMS) including more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of circular spots, wherein each spot is associated with one particular microscopic mirror and is freely movable across the system pupil surface by tilting this mirror.

Similar illumination systems are known from US 2006/0087634 A1, U.S. Pat. No. 7,061,582 B2 and WO 2005/026843 A2. Arrays of tiltable mirrors have also been proposed, for the same purpose, for EUV illumination systems.

SUMMARY

The present disclosure provides an illumination system with improved flexibility regarding the production of irradiance distributions in the system pupil surface. The present disclosure also provides a method of operating such an illumination system.

In one aspect, an illumination system includes a light source configured to produce projection light that propagates along a light path. The illumination system also includes a beam deflection array of reflective or transmissive beam deflection elements. Each beam deflection element is configured to deflect an impinging light beam by a deflection angle that is variable in response to a control signal. The beam deflection array is used in a first mode of operation to determine an irradiance distribution in a system pupil surface of the illumination system. The illumination system further includes a reflective or transmissive optical raster element, in particular a diffractive optical element, which is used in a second mode of operation to determine the irradiance distribution in the system pupil surface. An exchange unit is provided which is configured to hold the optical raster element in the second mode of operation such that it is inserted into the light path.

The illumination system of the present disclosure thus combines, in a single system, the advantages of both prior art approaches, namely, for producing a desired irradiance distribution in a system pupil surface, the use of an optical raster element on the one hand and the use of a beam deflection array on the other hand. The illumination system can be operated in the first mode of operation such that the beam deflection array determines the irradiance distribution in the system pupil surface. If an operator desires to use an optical raster element to this end, he can switch to the second mode of operation by inserting the optical raster element into the light path such that not the beam deflection array, but the optical raster element determines the irradiance distribution in the system pupil surface.

The combination of both approaches in a single illumination system has furthermore the advantage that it provides for redundancy. This is particular important with respect to the use of beam deflection arrays because it has been found that the production and control of such arrays is a complex task. For example, in the case of mirror arrays the tilting angle of each individual mirror has to be controlled very accurately under real time conditions, which involves substantial efforts both on hardware and also software level. If a single mirror of the mirror array or the mirror array in its entirety fails, the operator may switch to the second mode of operation so that the apparatus can still be used for exposing resists.

On the other hand, many operators of projection exposure apparatus have accumulated remarkable experiences with the conventional illumination systems including exchangeable diffractive optical elements and zoom axicon systems that allow modifications of the irradiance distribution in the system pupil surface at least to some extent. At least for conventional illumination settings this conventional approach works very well and reliable. Therefore the illumination system according to the disclosure meets the desire to use the same or similar diffractive optical elements as have been used before by the operators. Thus, at least for certain illumination settings, the experiences gained so far with diffractive optical elements can be advantageously used if the illumination system is operated in the second mode of operation.

A system pupil surface is defined as a surface (usually plane) having the property that an irradiance distribution in this surface translates into an angular distribution in a subsequent mask plane in which the mask to be illuminated can be arranged. Usually this involves a Fourier relationship between the system pupil surface on the one hand and the mask plane on the other hand.

Optical raster elements are considered, in the context of the present application, as optical elements including a plurality of minute structures. The main characteristic of an optical raster element is that it produces from an incoming (in particular a collimated) light beam a light beam having a specific angular distribution which is determined by the arrangement of the minute structures. Optical raster elements therefore introduce a divergence.

A reflective optical raster element may include a plurality of micro-mirrors that may have an axi-symmetrical or rotationally symmetrical shape, for example. More flexibility with regard to the production of a desired angular light distribution can be achieved if the reflective optical raster element is a reflective diffractive optical raster element, in particular a reflective computer generated hologram (CGH). Such elements may be designed such that the reflected light has almost any desired angular light distribution (i.e. the relationship between light intensity and light direction).

Transmissive optical raster elements may be configured as refractive optical elements which may include a plurality of axi-symmetrical or rotationally symmetrical microlenses, for example. Similar to the case of reflective optical raster elements, more flexibility with regard to the production of a desired angular light distribution may be achieved if the transmissive optical raster element is of the diffractive type, for example configured as a computer generated hologram (CGH).

The optical raster element may be removed from the light path in the second mode of operation by shielding it with the help of an additional mirror that is inserted in front of the array in the second mode of operation.

In an alternative embodiment no additional mirror is involved. Instead, a reflective optical raster element is used, and the exchange unit is arranged such that the reflective optical raster element covers, when it is inserted into the light path in the second mode of operation, the beam deflection array. Then the beam deflection array is shielded by the optical raster element. If the beam deflection array is a mirror array, the reflective optical raster element substantially substitutes for the mirror array in the second mode of operation.

If the optical raster element is of the transmissive type, it cannot shield the beam deflection array. The most effective way to accomplish a shielding of the beam deflection array is to use an actuating unit which is configured to hold a mirror in the second mode of operation such that the mirror covers the beam deflection array.

According to an alternative embodiment, the beam deflection array is not removed from the light path in the second mode of operation by shielding. Instead, the beam deflection elements are controlled such that the array has substantially the effect of a simple refractive element (such as a plane parallel plate) if the beam deflecting elements are of the transmissive type. If the beam deflecting elements are mirrors, these may be tilted such that the array has substantially the effect of a simple (preferably plane) mirror. In this embodiment the projection light passes through the beam deflection array or is reflected therefrom before it impinges on the optical raster element. Preferably the beam deflecting elements are controlled such that the optical raster element is homogenously illuminated. A drawback of this alternative embodiment is that the illumination system can operate neither in the first nor in the second mode of operation if the beam deflection array has failed.

In the simplest case an operator manually inserts the optical raster element into the light path when it is desired to switch from the first to the second mode of operation. The exchange unit may then be simply formed by a kind of frame into which the optical raster element is manually inserted. In order to avoid opening the hermetically sealed casing of the illumination system, a suitable gear may be used for manual insertion of the optical raster element into the light path.

In a preferred embodiment the exchange unit includes an actuator that is configured to insert the optical raster element into the light path when the operation is switched from the first mode to the second mode. No manual intervention is then involved. Instead, an operator may simply use a software control to change between the modes of operation.

In another embodiment the exchange unit includes a holder which includes a plurality of different optical raster elements. The holder is configured to insert one of the optical raster elements into the light path in the second mode of operation.

A suitable holder may be configured as a turret holder including a rotatable support disk which is configured to receive the different optical raster elements. The operator may then select a desired optical raster element from the set of optical raster elements received in the holder. If the holder is operated using a motor or another type of actuator, the illumination setting can be changed quickly without the need to manually intervene.

The support disk may include an aperture or a recess that is positioned in front of the beam deflection array in the first mode of operation. If the optical raster elements are of the reflective type, the holder will be moved, when switching to the second mode of operation, such that one of the reflective optical raster elements covers the beam deflection array and thus takes over its function of producing a desired irradiance distribution in the system pupil surface.

In order to be able to vary the irradiance distribution produced by the optical raster element in the system pupil surface, the illumination system may include a pupil shaping unit that is arranged between the beam deflecting array and the system pupil surface and which is configured to vary, in the second mode of operation, the irradiance distribution in the system pupil surface. Such a pupil shaping unit may include a zoom objective, and/or a pair of axicon elements and a manipulator to vary the distance between the ax-icon elements along an optical axis. If the axicon elements are in contact, they have usually only the effect of a plane parallel plate.

In one embodiment the illumination system is configured such that it can (still) be operated in the second mode of operation if the beam deflection array is removed completely from the illumination system. In this embodiment the beam deflection array may be used only for determining an optimized irradiance distribution in the system pupil surface (i.e. illumination setting). The regular projection operation, however, is performed in the second mode of operation. In this second mode a diffractive optical element or another type of optical raster element is used that has been manufactured such that it produces the irradiance distribution in the system pupil surface which had been optimized before with the help of the beam deflection array. Consequently, the beam deflection array can be removed from the illumination system and be installed in the illumination system of another projection exposure apparatus of the same type.

Reflective deflection elements may be formed by mirrors that can be tilted around at least one tilt axis. Preferably, the mirrors can be tilted about two orthogonal tilt axes so that they can direct an impinging light beam towards almost any arbitrary location on the system pupil surface.

Transmissive beam deflection elements may be formed by electro-optical or acousto-optical elements. In such elements the refractive index can be varied by exposing a suitable material to electric fields or ultrasonic waves, respectively. These effects can be exploited to produce index gratings that direct impinging light into various directions.

In an aspect, the disclosure provides a method that includes:
a) producing projection light that propagates along a light path;
b) directing the projection light on a beam deflection array of reflective or transmissive beam deflection elements, wherein each beam deflection element is configured to deflect an impinging light beam by a deflection angle that is variably in response to a control signal, and wherein the beam deflection array is used in a first mode of operation to determine an irradiance distribution in a system pupil surface of the illumination system;
c) switching to a second mode of operation by inserting an optical raster element into the light path such that not the beam deflection array, but the optical raster element determines the irradiance distribution in the system pupil surface.

The above remarks relating to the illumination system according to the present disclosure apply correspondingly.

If the beam deflection array is removed from the light path when switching from the first to the second mode of operation, the illumination system can be operated in the second mode of operation even if the beam deflection array has failed.

However, a removal of the beam deflection array from the light path does not necessarily imply that the beam deflection array as such is moved or that the light path has to be redirected. It may suffice to cover the beam deflection array with a mirror. If the optical raster element is of the reflective type, it may be used instead of such a covering mirror.

In one embodiment the method includes:
determining an optimized irradiance distribution in the system pupil surface during step a);
manufacturing an optical raster element that produces the irradiance distribution that has been determined in step a);
using the optical raster element in the second mode of operation;
optionally, removing the beam deflection array from the illumination system.

BRIEF DESCRIPTION OF THE DRAWINGS

Various features and advantages of the present disclosure may be more readily understood with reference to the following detailed description taken in conjunction with the accompanying drawing in which.

DESCRIPTION OF PREFERRED EMBODIMENTS

I. General Structure of Projection Exposure Apparatus

Figure 1:
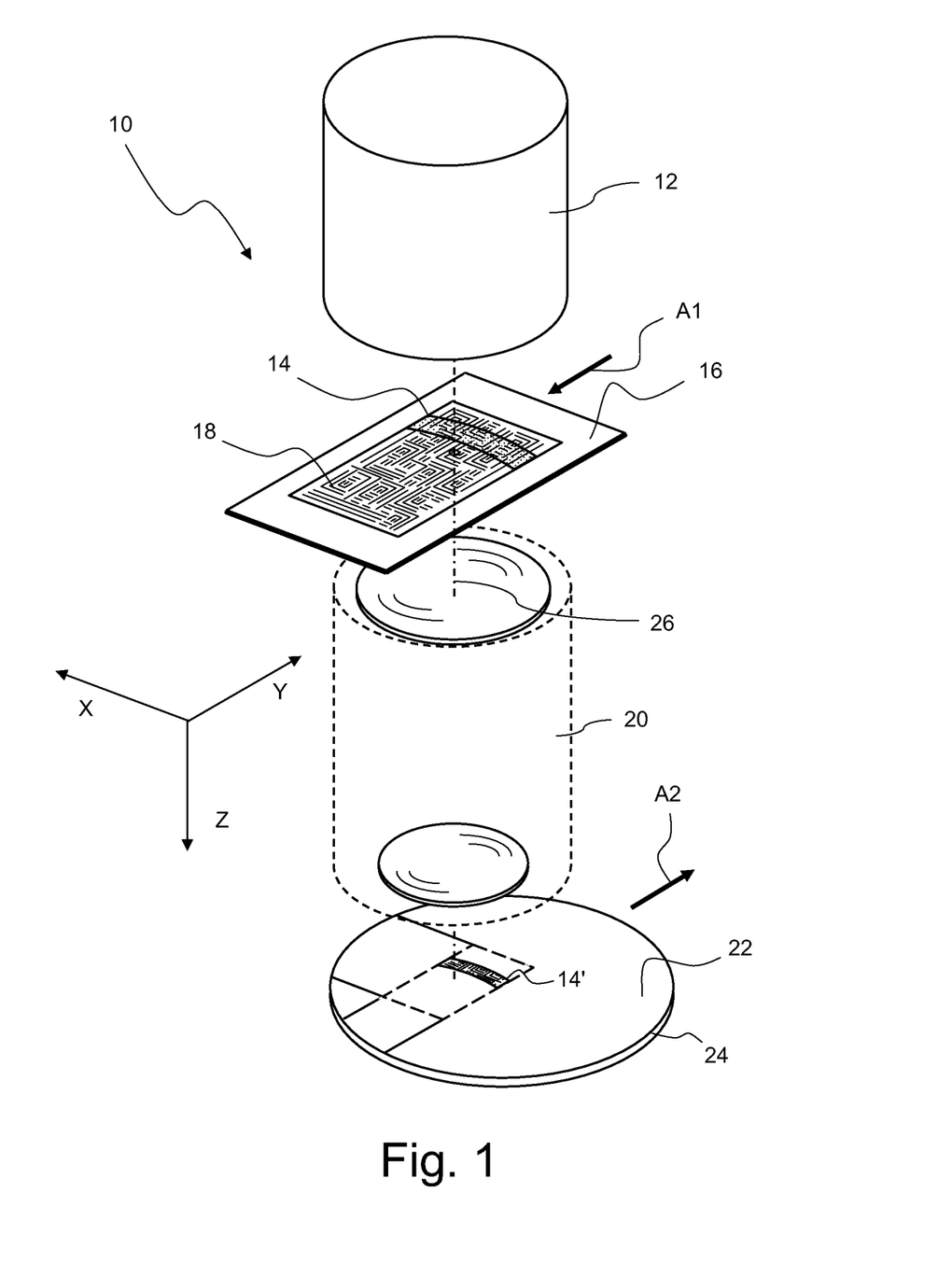
FIG. 1 is a perspective and considerably simplified view of a projection exposure apparatus in accordance with the present disclosure.

FIG. 1 is a perspective and highly simplified view of a projection exposure apparatus 10 that includes an illumination system 12 for producing projection light. The projection light illuminates a field 14 on a mask 16 containing minute structures 18. In this embodiment the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned by a mask stage (not shown) in an object plane of the projection objective 20. Since the latter has a magnification β with |β|≤1, a minified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan apparatus" or simply a "scanner". The ratio between the velocities of the substrate 24 and the mask 16 is equal to the magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the embodiment shown, the illuminated field 14 is not centered with respect to an optical axis 26 of the projection objective 20. Such an off-axis illuminated field 14 may be used with certain types of projection objectives 20. In other embodiments, the illuminated field 14 is centered with respect to the optical axis 26.

EUV projection exposure apparatus, in which the present disclosure is also applicable, have the same basic structure. However, because there are no optical materials that are transparent for EUV radiation, only mirrors are used as optical elements, and also the mask is of the reflective type.

II. General Structure of Illumination System

Figure 2:
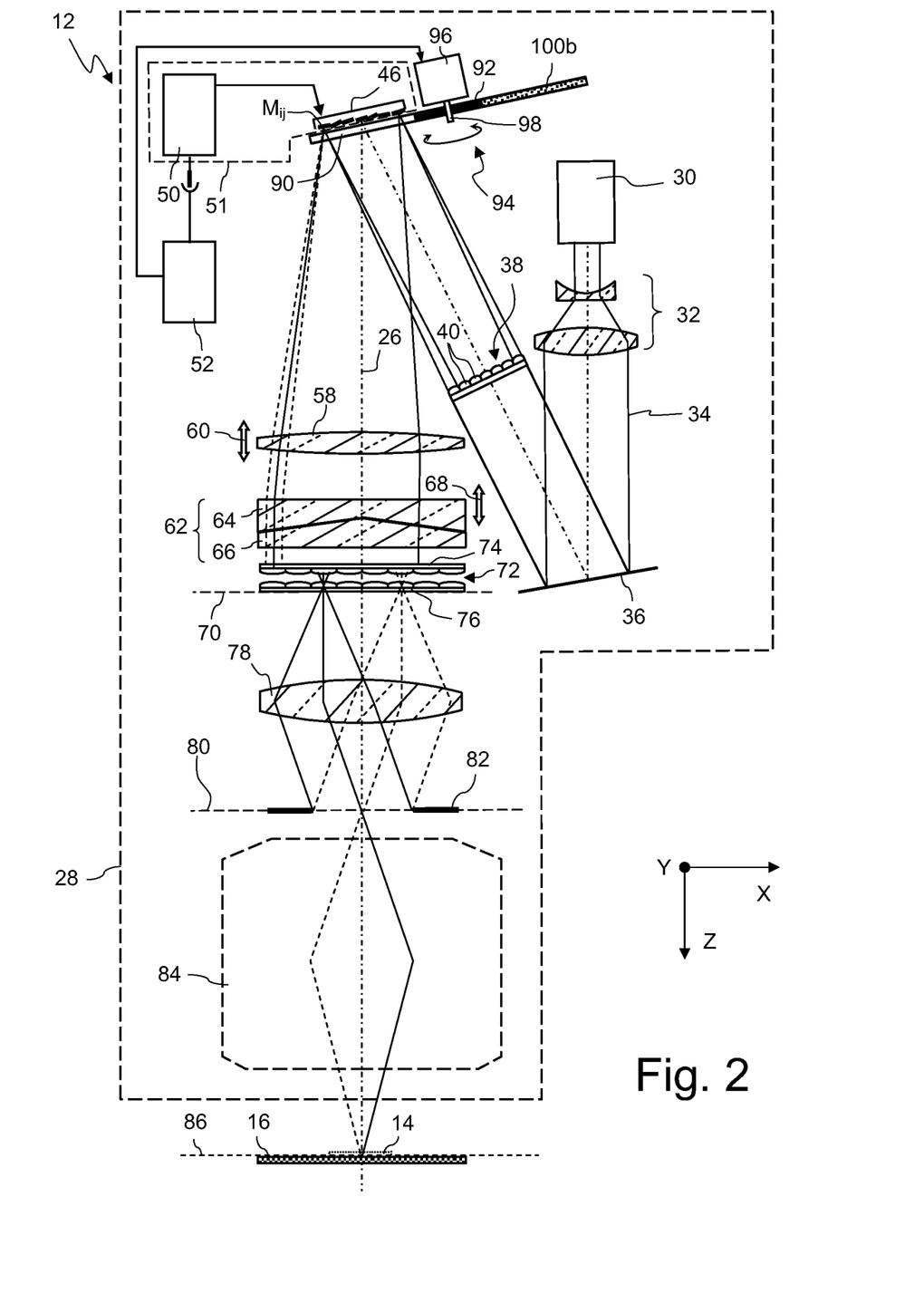
FIG. 2 is a meridional section through an illumination system contained in the projection exposure apparatus shown in FIG. 1.

FIG. 2 is a more detailed meridional section through the illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wavelengths, for example 248 nm or 157 nm, are also contemplated.

In the embodiment shown, the projection light emitted by the excimer laser 30 enters a beam expansion unit 32 in which the light beam is expanded without altering the geometrical optical flux. The beam expansion unit 32 may include several lenses as shown in FIG. 2, or a mirror arrangement, for example. The projection light emerges from the beam expansion unit 32 as a substantially collimated beam 34. In other embodiments, this beam may have a significant divergence. The collimated beam 34 impinges on a plane folding mirror 36 provided for reducing the overall dimensions of the illumination system 12.

After reflection from the folding mirror 36, the beam 34 impinges on an array 38 of microlenses 40 and then passes, now as a bundle of sub-beams, in a first mode of operation through an open aperture 90 provided in a support disk 92 of a turret holder 94, which will be described in more detail further below in section III. A mirror array 46 is arranged in or in the vicinity to a back focal plane of the microlenses 40. As will be explained in more detail below, the mirror array 46 includes a plurality of small individual mirrors $M_{ij}$ that can be tilted, independently from each other, by two tilt axes that are preferably aligned perpendicularly to each other. The total number of mirrors $M_{ij}$ may exceed 100 or even several 1000. The reflecting surfaces of the mirrors $M_{ij}$ may be plane, but could also be curved, if an additional reflective power is desired. Apart from that, the mirror surfaces may support diffractive structures. In this embodiment the number of mirrors $M_{ij}$ is equal to the number of microlenses 40 contained in the microlens array 38. Thus each microlens 40 directs a converging light beam on one mirror $M_{ij}$ of the mirror array 46.

The tilting movements of the individual mirrors $M_{ij}$ are controlled by a mirror control unit 50 which is connected to an overall system control 52 of the illumination system 12. Actuators, which are used to set the desired tilt angles of the mirrors $M_{ij}$, receive control signals from the mirror control unit 50 such that each individual mirror $M_{ij}$ is capable of reflecting an impinging light ray by a reflection angle that is variable in response to the control signal. In the embodiment shown there is a continuous range of tilt angles at which the individual mirrors $M_{ij}$ can be oriented. In other embodiments, the actuators are configured such that only a limited number of discrete tilt angles can be set.

In this embodiment the mirror array 46 and the mirror control unit 50 commonly form a mirror array module 51. Additional components closely related to the mirror array 46, for example a measuring system as disclosed in WO 2008/095695 A2 which is used for measuring the tilting angles of the mirrors $M_{ij}$, may also be part of the mirror module 51. The module 51 is received within the housing 28 of the illumination system 12 such that it can easily be removed as a single unit from the illumination system 12, and also such that it can be easily installed again into the illumination system 12 at a later time. This may involve using a suitable mechanical mounting technology and providing electrical connectors, for example to connect the module 51 to the overall system control 52, that can be easily detached and connected.

Figure 3:
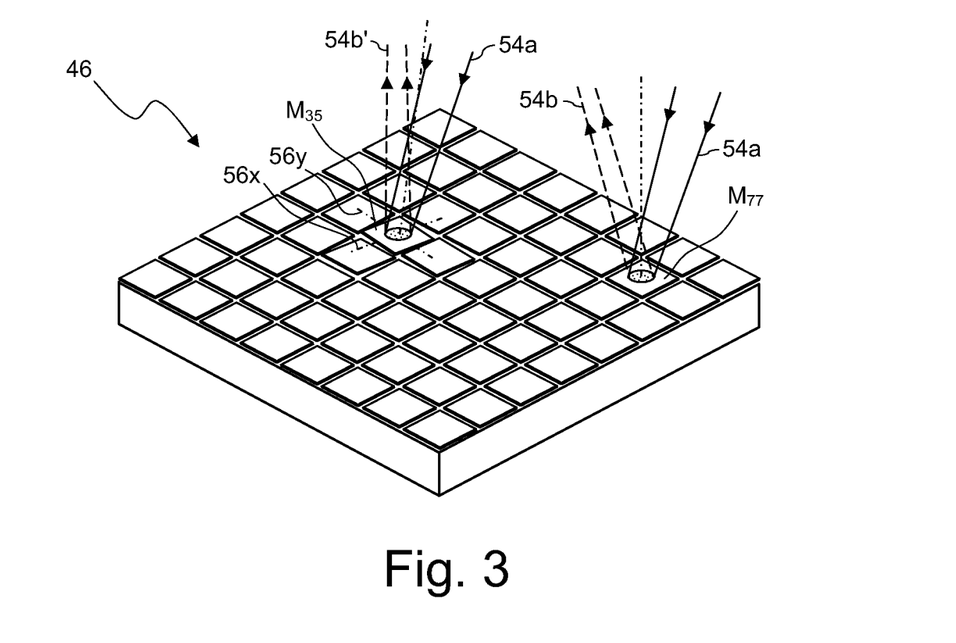
FIG. 3 is a perspective view of a mirror array contained in the illumination system of FIG. 2.

FIG. 3 is a perspective view of the mirror array 46 including, for the sake of simplicity, only 8·8=64 mirrors $M_{ij}$. Sub-beams 54a, which are produced by the microlenses 40 and impinge on the mirror array 46, are reflected to different directions determined by the tilt angles of the mirrors $M_{ij}$. In this schematic representation it is assumed that a particular mirror $M_{35}$ is tilted about two tilt axes 56x, 56y relative to another mirror $M_{77}$ so that the sub-beams 54b, 54b', which are reflected by the mirrors $M_{35}$ and $M_{77}$, respectively, are reflected into different directions.

Referring again to FIG. 2, the illumination system 12 according to this embodiment further includes a zoom objective 58 having a variable focal length. The zoom objective 58 is, for the sake of simplicity, represented in FIG. 2 by a single lens only which is displaceable along the optical axis 26 of the illumination system 12, as is indicated by a double arrow 60.

Behind the zoom objective 58 a pair 62 of axicon elements 64, 66 having opposing conical surfaces is arranged. If both axicon elements 64, 66 are in immediate contact, the ax-icon pair 62 has only the effect of a plane parallel plate. If both axicon elements 64, 66 are moved apart, as is indicated in FIG. 2 by a double arrow 68, the spacing between the ax-icon elements 64, 66 causes a shift of light energy radially outward. Since axicon elements are known as such in the art, they will not be explained here in further detail.

Reference numeral 70 denotes a system pupil surface of the illumination system 12. The irradiance distribution in the system pupil surface 70 substantially defines the angular distribution of the light impinging on the mask 14. The system pupil surface 70 is usually plane or slightly curved and is, in the embodiment shown, arranged in or in immediate vicinity of an optical integrator 72 which produces a plurality of secondary light sources. The optical integrator 72 is generally formed by an optical raster element; in this embodiment this optical raster element is configured as a fly's eye lens including two substrates 74, 76 that each includes two orthogonal arrays of parallel cylindrical microlenses. Other configurations of the optical integrator are envisaged as well, for example integrators including an array of microlenses that have rotationally symmetrical surfaces, but rectangular boundaries. Reference is made to WO 2005/078522 A, US 2004/0036977 A1 and US 2005/0018294 A1, in which various types of optical raster elements suitable as optical integrators 72 are described.

The optical integrator 72 increases the range of angles formed between the light rays and an optical axis 26 of the illumination system 12. As the angular distribution in the system pupil surface 70 directly translates into an intensity distribution in a subsequent field plane, the optical integrator 72 determines the aspect ratio of the illuminated field 14 on the mask 16. Since the optical integrator 72 increases the range of angles considerably more in the X direction then in the Y direction, the illuminated field 14 has larger dimensions along the X direction than along the Y direction (i.e. the scan direction).

The projection light emerging from the secondary light sources produced by the optical integrator 72 enters a condenser 78 that is represented in FIG. 2 by a single lens only for the sake of simplicity. The condenser 78 ensures a Fourier relationship between the system pupil surface 70 and a subsequent intermediate field plane 80 in which a field stop 82 is arranged. The condenser 78 superimposes the light beams, which are produced by the secondary light sources, in the intermediate field plane 80, thereby achieving a very homogenous illumination of the intermediate field plane 80. The field stop 82 may include a plurality of movable blades and ensures sharp edges (at least those extending along the Y direction) of the illuminated field 14 on the mask 16.

A field stop objective 84 provides optical conjugation between the intermediate field plane 80 and the mask plane 86 in which the mask 16 is arranged. The field stop 82 is thus imaged by the field stop objective 84 onto the mask 16.

It should be well understood that various alternative embodiments are presently contemplated that are still within the scope of the present disclosure.

For example, the mirror array 46 may be replaced by any other deflective structure that makes it possible to direct light rays impinging on the structure into various directions, wherein the directions can be changed individually for different portions of the structure upon application of a suitable control signal. Such alternative structures may include, for example, electro-optical or acousto-optical elements. In such elements the refractive index may be varied by exposing a suitable material to ultrasonic waves or electric fields, respectively. These effects can be exploited to produce index gratings that direct impinging light into various directions.

As a matter of course, the zoom objective 60 and/or the pair 62 of axicon elements 64, 66 may be completely dispensed with. The fly's-eye lens 72 could be replaced by any other optical raster element, for example a diffractive optical element, which increases the geometrical optical flux. The use of a light mixing rod instead of a fly's eye lens is also contemplated. Furthermore, the mask 16 may be directly positioned in the field plane 80 if there is no need to have an illuminated field 14 having sharp edges at least along one direction. Also illumination systems in which first the field and then the pupil is shaped are presently contemplated.

III. Turret Holder

Modes of Operation

In the following the configuration and function of the turret holder 94 will be explained in more detail with reference to FIGS. 2 to 7.

The turret holder 94 includes, in the embodiment shown, an electric motor 96 which drives an axis 98 on which the support disk 92 is fixed. The support disk 92 can thus be rotated around the axis 98 with the help of the motor 96. In this embodiment the support disk 92, which is also shown in a top view in FIG. 4, includes a plurality of apertures which are configured to receive different reflective diffractive optical elements 100a, 100b and 100c. Each of the reflective diffractive optical elements 100a, 100b, 100c produces a different angular light distribution if illuminated by projection light.

Figure 4:
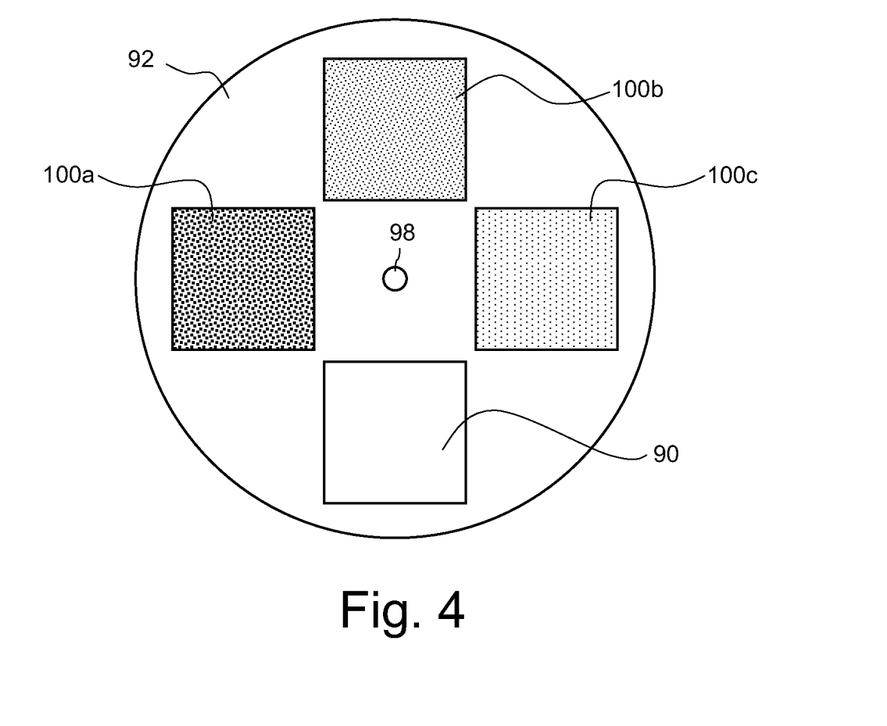
FIG. 4 is a top view on a support disk of a turret holder receiving a plurality of reflective diffractive optical elements.

The apertures may be configured such that the diffractive optical elements 100a, 100b, 100c can be inserted along guide structures and be locked or otherwise fixed to the support disk 92 rotates. One of the apertures, denoted with 90, remains open so that projection light can pass through the open aperture 90 unobstructed.

In the first mode of operation shown in FIG. 2 the support disk 92 is rotated such that the open aperture 90 is arranged immediately above the mirror array 46, as has been explained further above. Thus the sub-beams produced by the microlenses 40 of the microlens array 38 can impinge unimpeded by the support disk 92 on the mirrors $M_{ij}$ of the mirror array 46. The irradiance distribution in the system pupil surface 70 is therefore mainly determined by the orientations of the mirrors $M_{ij}$. None of the reflective diffractive optical elements 100a, 100b, 100c is inserted in the light path in this first mode of operation.

Figure 5:
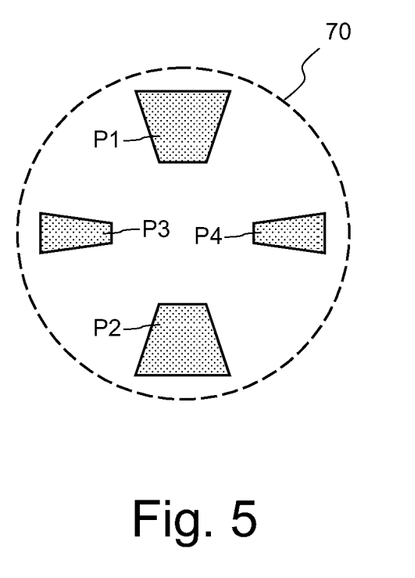
FIG. 5 is an illustration of a first exemplary irradiance distribution in the system pupil surface obtained in a first mode of operation.

FIG. 5 illustrates schematically an exemplary irradiance distribution that may be produced with the help of the mirror array 46 in the system pupil surface 70. As can be seen, the irradiance distribution corresponds to a customized quadrupole illumination setting which differs from standard quadrupole settings in that the pairs of opposite poles P1, P2 on the one hand and P3, P4 on the other hand have different geometries and sizes. If the operator of the apparatus 10 desires to slightly modify this illumination setting, this can be easily accomplished by changing the orientation of at least some of the mirrors $M_{ij}$.

Figure 6:
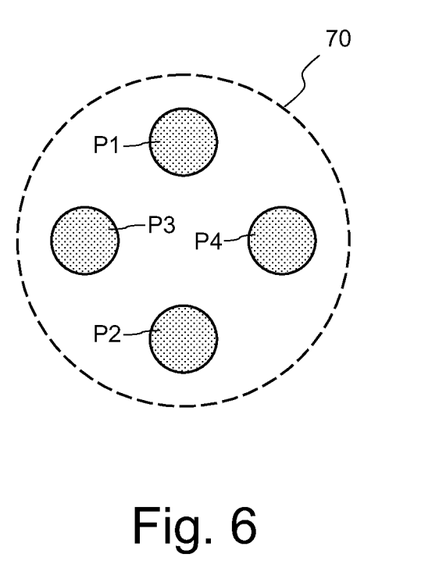
FIG. 6 is an illustration of a second exemplary irradiance distribution in the system pupil surface obtained in a second mode of operation.

FIG. 6 illustrates another irradiance distribution in the system pupil surface 70 which corresponds to a standard quadrupole illumination setting. All poles P1, P2, P3 and P4 have equal geometries and sizes and are arranged with four-fold symmetry in the system pupil surface 70. Although this, or at least a very similar, illumination setting could also be produced with the help of the mirror array 46, the operator of the apparatus 10 may nevertheless desire to produce this irradiance distribution in the system pupil surface 70 not with the help of the mirror array 46, but by using a suitable one of the reflective diffractive optical elements 100a, 100b or 100c. The reason for doing this may be that the operator has used this particular diffractive optical element 100a, 100b or 100c in the past very successfully, and the operator is not ready to approximate this irradiance distribution by a similar irradiance distribution produced with the help of the mirror array 46.

Another motivation for producing the irradiance distribution shown in FIG. 6 with the help of a diffractive optical element may be that the mirror array 46 is not available due to maintenance works, for example. In this case the operation of the apparatus 10 may be continued although the mirror array 46 cannot be used temporarily.

If the operator desires to use one of the diffractive optical elements 100a, 100b, 100c instead of the mirror array 46 for producing the irradiance distribution in the system pupil surface 70, he can switch to a second mode of operation by causing, for example using software control, the motor 96 of the turret holder 94 to rotate the support disk 92 until the desired diffractive optical element 100a, 100b or 100c is positioned immediately in front of the mirror array 46.

Figure 7:
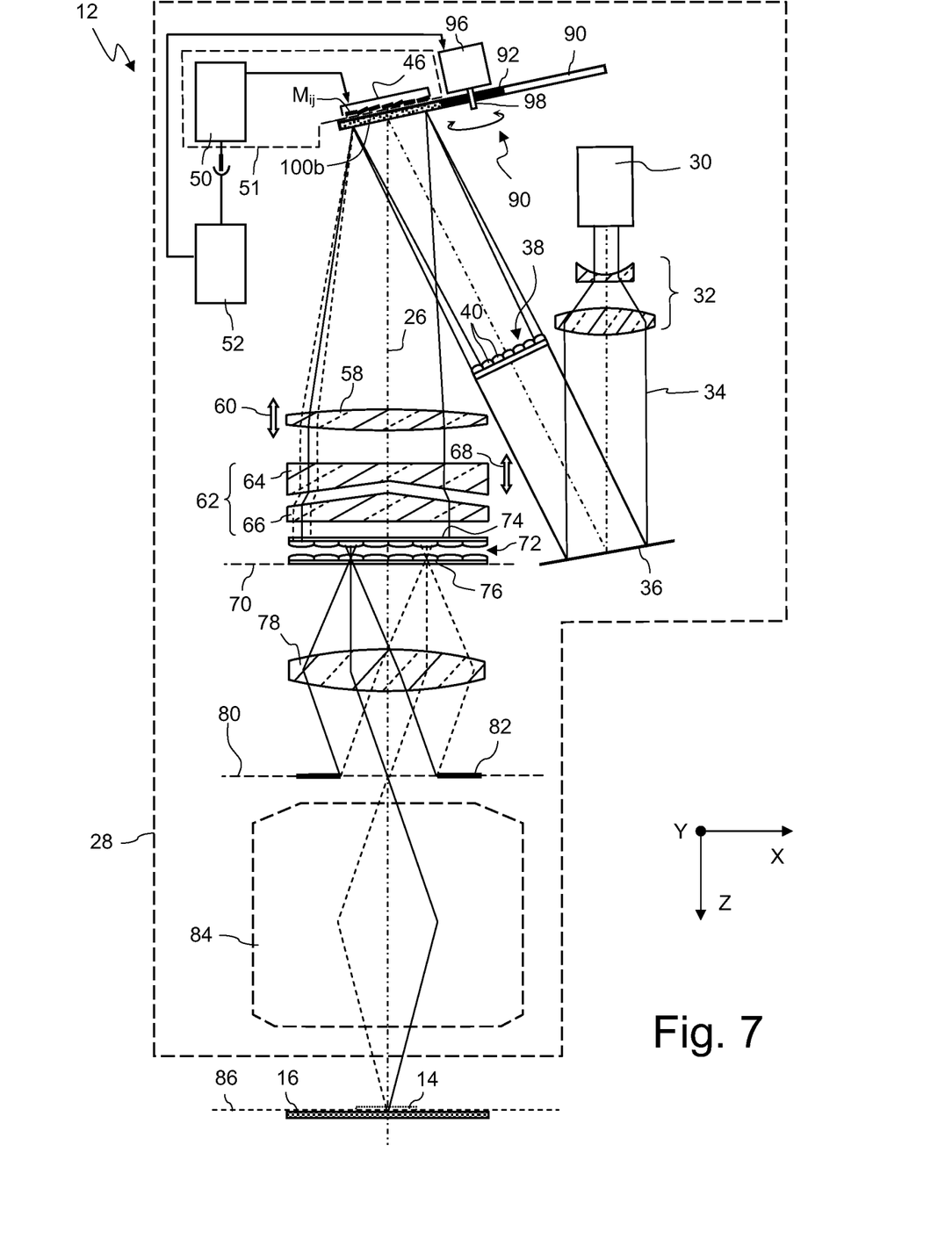
FIG. 7 is a meridional section through the illumination system shown in FIG. 2, but in the second mode of operation.

FIG. 7 shows the illumination system 12 in this second mode of operation. The selected diffractive optical element, here element 100b, is now positioned such that it completely covers the mirrors $M_{ij}$. Since the diffractive optical elements 100a, 100b and 100c are of the reflective type, no projection light can impinge any more on the mirrors $M_{ij}$, and consequently the mirror array 46 is effectively removed from the light path. Instead the diffractive optical element 100b is inserted into the light path and substantially substitutes, in functional terms, for the mirror array 46. The irradiance distribution in the system pupil surface is now mainly determined by the angular distribution produced by the diffractive optical element 100b which has been inserted into the light path. If it is desired that the diffractive optical element 100b shall be illuminated with a single homogenous light beam and not by the plurality of sub-beams produced by the microlens array 38, the latter may be removed from the light path with the help of an actuator (not shown).

For modifying the irradiance distribution in the system pupil surface 70, the zoom objective 58 and/or the pair 62 of axicon elements 64, 66 may be used. With the help of these components it is possible, for example, to modify the position and/or size of the poles P1 to P4 shown in FIG. 6.

If the operator desires to produce another standard illumination setting, for example a dipole illumination setting, the turret holder 94 may be operated again so as to insert one of the other diffractive optical elements 100a or 100c into the light path.

In the second mode of operation the mirror array module 51 is not used. The mirror array module 51 may therefore be removed from the illumination system 12 and can be used in another illumination system 12 which is prepared to receive the module 51.

This opens up a new approach for operating the projection exposure apparatus 10. Namely, the mirror array 46 may be used in the first mode of operation only with a view to determine an illumination setting which is optimized with regard to a specific mask 16. Once this optimized illumination setting is determined, a diffractive optical element is manufactured that produces the same illumination setting as has been determined before with the help of the mirror array 46. Consequently, this diffractive optical element is also optimized with regard to the specific mask 16.

Then the illumination system 12 is only operated in the second mode of operation with the diffractive optical element. The mirror array module 51 is not used and may be installed in the illumination system of another projection exposure apparatus 10, where it is used to find an optimized illumination setting for a different mask. When another mask shall be projected in the projection exposure apparatus, the mirror array module 51 may be installed again so that a new illumination setting can, with the help of the mirror array 46, be determined that is perfectly adapted to the new mask. Then another diffractive optical element is manufactured that produces this new illumination setting, and so on.

IV. Alternative Embodiments a) Transmissive Optical Raster Element

Figure 8:
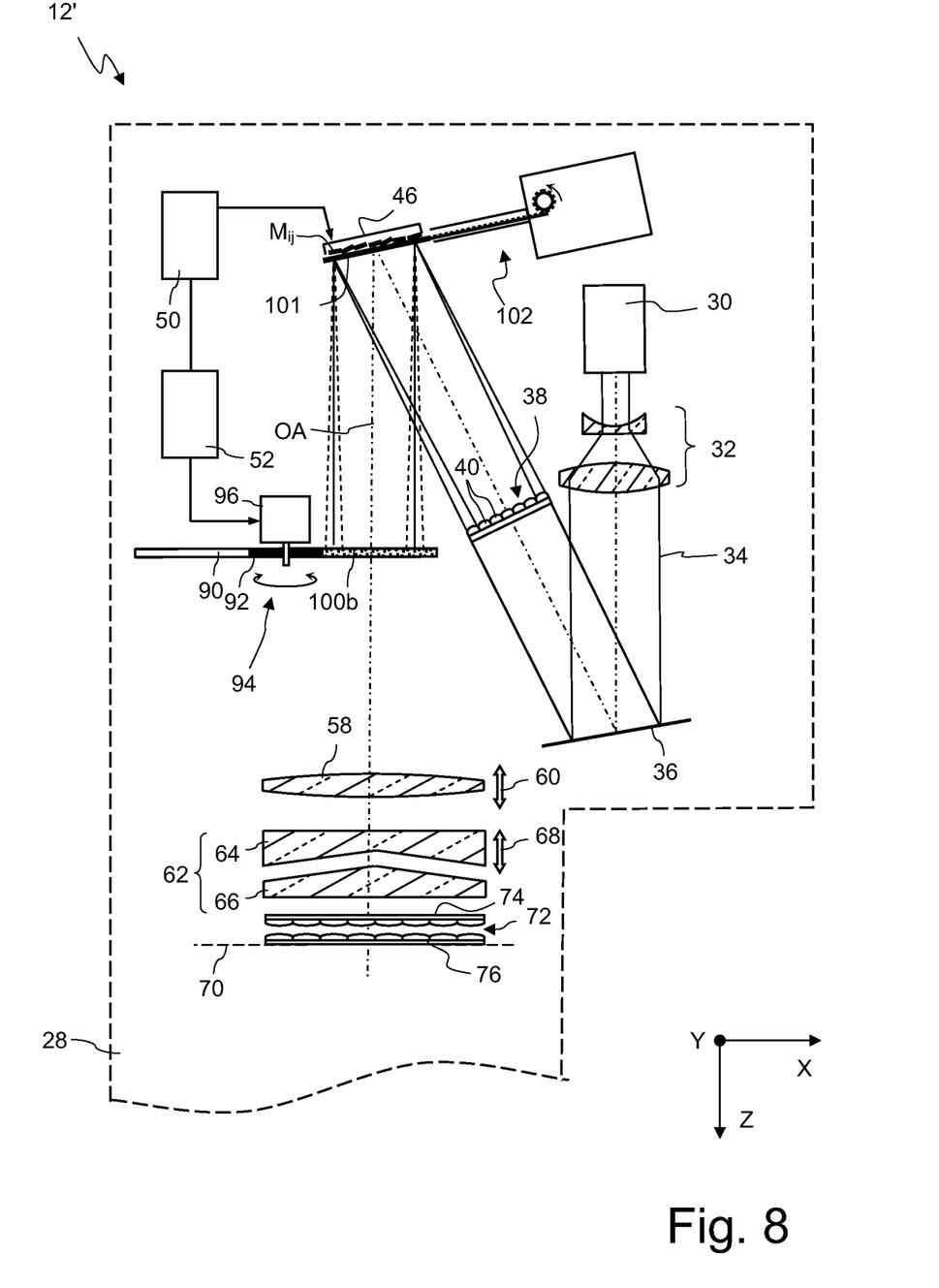
FIG. 8 is a meridional section through an alternative embodiment of an illumination system according to the present disclosure which is also suitable for being used in the apparatus shown in FIG. 1.

FIG. 8 is a meridional section through another embodiment of a DUV illumination system which may be used in the projection exposure apparatus 10 shown in FIG. 1. Those components which are, in the light propagation direction, arranged behind the system pupil surface 70 are identical to the components of the embodiment shown in FIG. 2 and are therefore omitted for the sake of simplicity.

The illumination system 12' shown in FIG. 8 differs from the illumination system 12 shown in FIGS. 2 and 7 mainly in that the diffractive optical elements used to produce a desired irradiance distribution in the system pupil surface 70 in the second mode of operation are not of the reflective, but of the transmissive type. Such a transmissive diffractive optical element, however, cannot shield the mirror array 46 if it is inserted into the light path such that it is arranged immediately above the mirror array 46.

For this reason an additional mirror 101 is inserted into the light path in the second mode of operation which is shown in FIG. 8. The mirror 101 will generally be plane, but may also be curved, particularly if also the mirrors $M_{ij}$ are arranged on a curved support. For inserting the mirror 101 into the light path an actuating unit 102 is provided which is only schematically illustrated in FIG. 8. The actuating unit 102 is configured such that it can insert the mirror 101 into the light path and withdraw it therefrom using a suitable gear. As a matter of course, the mirror 101 may also be arranged in a turret holder having a support disk with a clear opening which is arranged in front of the mirror array 46 in the first mode of operation. Still other approaches to insert the mirror 101 into the light path and to withdraw it therefrom will be apparent to those skilled in the art.

The turret holder 94 for inserting the diffractive optical elements into the light path in the second mode of operation is arranged in this embodiment in the light path between the mirror 101 and the zoom objective 58.

If the operator of the apparatus 10 desires to change from the second mode of operation shown in FIG. 8 to the first mode of operation in which the irradiance distribution in the system pupil surface 70 is mainly determined by the mirror array 46, the actuating unit 102 is operated such that the mirror 101 is withdrawn from the light path. Additionally, the motor 96 of the turret holder 94 is controlled such that the diffractive optical element 100b is withdrawn from the light path. An open aperture 90 or a recess provided in the support disk 92 may be positioned in the light path so that the support disk 92 does not obstruct the projection light on its way between the mirror array 46 to the system pupil surface 70. Usually also the axicon element 64 will be moved such that it gets in contact with the other axicon element 66. Then the pair 62 of axicon elements 66, 64 has only the effect of a plane parallel plate, and the irradiance distribution in the system pupil surface 70 is mainly determined by the mirror array 46.

b) Third Mode of Operation

If the operator desires to produce a conventional or annular illumination setting, this may be accomplished solely with the help of the zoom objective 58 and the pair 60 of axicon elements 62, 64. In this mode of operation the mirror 101 is inserted into the light path, and the diffractive optical elements received in the support disk 92 of the turret holder 94 are withdrawn from the light path such that the projection light passes through the clear aperture 90. Additionally, the microlens array 38 may be withdrawn from the light path with the help of a suitable actuator (not shown).

A similar effect can also be achieved in the first embodiment shown in FIGS. 2 to 7 if the support disk 92 contains a mirror. If this mirror is arranged immediately in front of the mirror array 46, neither the beam array 46 nor any of the diffractive optical elements 100a, 100b or 100c is capable of producing an angular light distribution which modifies the irradiance distribution in the system pupil surface 70. Instead, only the zoom objective 58 and the pair 62 of axicon elements 64, 66 will determine the irradiance distribution in the system pupil surface 70.

The above description of the preferred embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. An illumination system having a pupil surface, the illumination system comprising:
    a light source configured to produce projection light that propagates through the illumination system along a light path;
    a beam deflection array comprising a plurality of beam deflection elements, each beam deflection element being reflective, each beam deflection element being configured to deflect an impinging light beam by a variable deflection angle, and the beam deflection array being configured to determine an irradiance distribution in the pupil surface in a first mode of operation of the illumination system;
    an optical raster element configured to determine the irradiance distribution in the pupil surface in a second mode of operation of the illumination system; and
    an exchange unit configured to hold the optical raster element in the light path in the second mode of operation of the illumination system,
    wherein:
        in the second mode of operation of the illumination system, the optical raster element covers the beam deflection array so that the beam deflection array is not in the light path; and
        the illumination system is a microlithographic illumination system.

2. The illumination system of claim 1, wherein the optical raster element is a diffractive optical element.

3. The illumination system of claim 1, wherein the optical raster element is a reflective optical raster element.

4. The illumination system of claim 3, wherein the exchange unit is configured to move the optical raster element so that, when the reflective optical raster element is in the light path in the second mode of operation of the illumination system, the reflective optical raster element covers the beam deflection array.

5. The illumination system of claim 1, wherein the exchange unit comprises an actuator configured so that, when the illumination system is switched from the first mode of operation to the second mode of operation, the actuator inserts the optical raster element into the light path.

6. The illumination system of claim 1, wherein the exchange unit comprises a holder comprising a plurality of optical raster elements, and the holder is configured so that, in the second mode of operation of the illumination system, the holder inserts one of the optical raster elements into the light path.

7. The illumination system of claim 6, wherein the holder comprises a turret holder comprising a rotatable support disk configured to receive the optical raster elements.

8. The illumination system of claim 7, wherein the rotatable support disk has an aperture or a recess, and, in the first mode of operation of the illumination system, the aperture or recess is in front of the beam deflection array.

9. The illumination system of claim 1, further comprising a pupil shaping unit between the beam deflection array and the pupil surface, wherein the pupil shaping unit is configured so that, in the second mode of operation of the illumination system, the pupil shaping unit varies the irradiance distribution in the pupil surface.

10. The illumination system of claim 1, wherein the beam deflection array is removed from the illumination system when the illumination system is in the second mode of operation.

11. A projection exposure apparatus, comprising:
the illumination system of claim 1; and
a projection objective,
wherein the projection exposure apparatus is a microlithographic projection exposure apparatus.

12. A method, comprising:
a) providing a microlithographic projection exposure apparatus comprising an illumination system, the illumination system comprising:
a beam deflection array comprising a plurality of beam deflection elements, each beam deflection element being reflective, each beam deflection element being configured to deflect an impinging light beam by a variable deflection angle;
b) propagating projection light along a light path through the illumination system;
c) using the beam deflection array to determine an irradiance distribution in a pupil surface of the illumination system; and
d) subsequently inserting an optical raster element into the light path so that: i) the optical raster element covers the beam deflection array so that the beam deflection array is not in the light path; and ii) the optical raster element determines the irradiance distribution in the pupil surface.

13. The method of claim 12, further comprising removing the beam deflection array from the light path b) and c).

14. The method of claim 13, wherein the optical raster element is a reflective optical raster element.

15. The method of claim 12, further comprising:
determining a desired irradiance distribution in the pupil surface while propagating the projection light along the light path;
manufacturing an optical raster element that produces the desired irradiance distribution in the pupil surface; and
during d) using the optical raster element in the second mode of operation.

16. The method of claim 15, further comprising removing the beam deflection array from the illumination system between c) and d).

17. An illumination system having a pupil surface, the illumination system comprising:
a light source configured to produce projection light that propagates through the illumination system along a light path;
a beam deflection array comprising a plurality of beam deflection elements, each beam deflection element being reflective, each beam deflection element being configured to deflect an impinging light beam by a variable deflection angle, and the beam deflection array being configured to determine an irradiance distribution in the pupil surface in a first mode of operation of the illumination system; and
an optical raster element configured to determine the irradiance distribution in the pupil surface in a second mode of operation of the illumination system;
wherein:
the optical raster element is in the light path in the second mode of operation of the illumination system;
in the second mode of operation of the illumination system, the optical raster element covers the beam deflection array so that the beam deflection array is not in the light path; and
the illumination system is a microlithographic illumination system.

18. A projection exposure apparatus, comprising:
the illumination system of claim 17; and
a projection objective,
wherein the projection exposure apparatus is a microlithographic projection exposure apparatus.

* * * * *